United States Patent [19]

Bottomley

[11] Patent Number: 4,647,858
[45] Date of Patent: Mar. 3, 1987

[54] METHODS FOR OVERCOMING TRANSIENT MAGNETIC FIELD INHOMOGENEITY IN NUCLEAR MAGNETIC RESONANCE IMAGING

[75] Inventor: Paul A. Bottomley, Clifton Park, N.Y.

[73] Assignee: General Electric Company, Schenectady, N.Y.

[21] Appl. No.: 760,222

[22] Filed: Jul. 29, 1985

[51] Int. Cl.[4] ............................................. G01R 33/20
[52] U.S. Cl. ..................................... 324/320; 324/322
[58] Field of Search ............... 324/300, 307, 309, 311, 324/312, 313, 318, 319, 320, 322

[56] References Cited

U.S. PATENT DOCUMENTS

| | | | |
|---|---|---|---|
| 4,284,948 | 8/1981 | Young | 324/309 |
| 4,284,950 | 8/1981 | Burl et al. | 324/320 |
| 4,585,993 | 4/1986 | Bottomley | 324/309 |
| 4,591,789 | 5/1986 | Glover et al. | 324/309 |
| 4,612,504 | 9/1986 | Pelc | 324/309 |

Primary Examiner—Michael J. Tokar
Attorney, Agent, or Firm—Geoffrey H. Krauss; James C. Davis, Jr.; Marvin Snyder

[57] ABSTRACT

Methods for overcoming transient magnetic field gradient inhomogeneity in a nuclear magnetic resonance imaging and/or nuclear magnetic resonance spectroscopic imaging system, wherein the inhomogeneities are induced by the pulsed magnetic field gradients utilized in the imaging process itself, provide at least one correction pulse signal during, or after, any application of the desired magnetic field to the sample-to-be-investigated in the system. At least one of the pulse signal characteristics is adjusted to oppose and substantially cancel an error-producing portion of the total magnetic field gradient in a particular direction. The magnetic field gradient correction signal(s) can be applied: during a non-selective RF pulse; immediately subsequent to an initial gradient field application (either alone or coincident with a selective 180° RF pulse); during acquisition of response signal data; or at any time to correct for inter-gradient cross-talk conditions.

24 Claims, 6 Drawing Figures

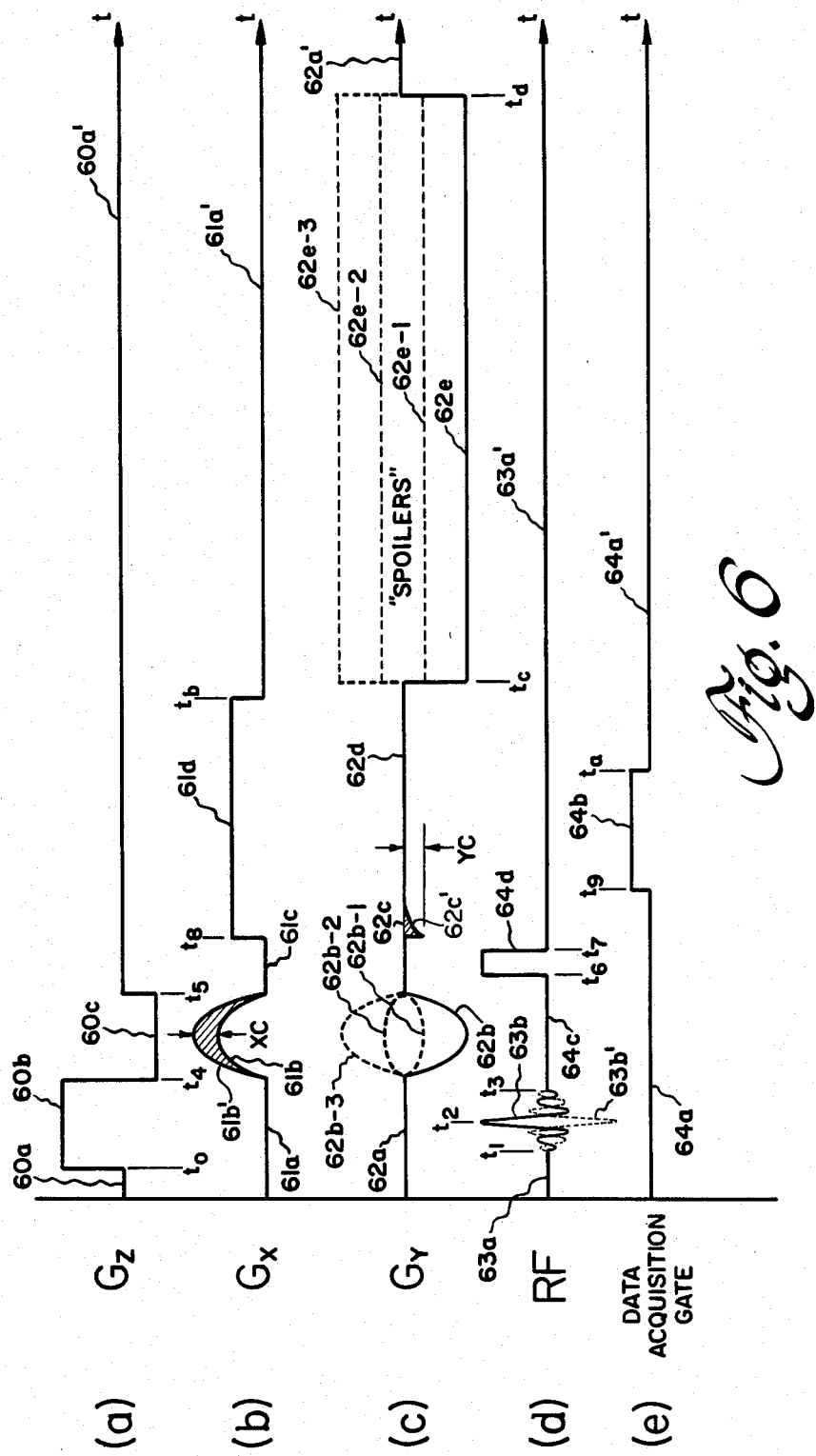

METHODS FOR OVERCOMING TRANSIENT MAGNETIC FIELD INHOMOGENEITY IN NUCLEAR MAGNETIC RESONANCE IMAGING

BACKGROUND OF THE INVENTION

The present invention relates to nuclear magnetic resonance (NMR) imaging and nuclear magnetic resonance chemical shift spectroscopic imaging and, more particularly, to novel methods for overcoming transient inhomogeneities in the imaging magnetic field, especially as induced by the pulsed magnetic field gradients utilized in the imaging process itself.

It is now well known that nuclear magnetic resonance imaging can be utilized for in vivo studies, particularly of human patients, to image proton ($^1$H) densities and the like. It is also known to study other nuclear species in a heterogeneous sample by chemical shift spectroscopy and the like, at either a single site or at each of an array of a plurality of ordered sites in the sample. Of these studies, nuclear magnetic resonance chemical shift spectroscopy imposes the more demanding requirements upon a nuclear magnetic resonance imaging system. A pivotal requirement for the performance of magnetic resonance chemical shift spectroscopic imaging is that the magnetic field utilized must be sufficiently uniform so that a chemical shift spectrum is resolvable from each sensitive volume or image volume (voxel) element. For nuclear species, such as protons ($^1$H), phosphorous ($^{31}$P), carbon ($^{13}$C), and the like, to be studied by in vivo nuclear magnetic resonance spectroscopy, magnetic field homogeneities of better than about one part-per-million (ppm) across a voxel are necessary. This homogeneity requirement can extend to the entire imaged volume, in techniques such as the selective irradiation chemical shift imaging technique disclosed and claimed in my co-pending U.S. patent application Ser. No. 561,381, filed Dec. 14, 1983, and assigned to the assignee of the present invention, which co-pending application is included herein in its entirety by reference. Techniques such as the foregoing example require magnetic field homogeneity better than about 1 ppm. across the entire imaging volume.

In practice, many NMR imaging techniques, and particularly spectroscopic imaging techniques, employ pulsed magnetic field gradients. Examples of such techniques can be found in my U.S. Pat. No. 4,506,223 issued Mar. 19, 1985, and my U.S. Pat. No. 4,480,228 issued Oct. 30, 1984, both assigned to the assignee of the present invention and incorporated herein by reference in their entireties. Such magnetic field gradient pulses will often induce eddy currents in any conductor within a certain distance of the main magnetic-field-forming structure of the magnetic resonance system. In high-field systems utilizing superconducting magnets, the magnetic cryostat or other structural metal is within the gradient pulsed magnetic field and eddy currents will often be induced within these metal components. Each induced eddy current may decay at its own individual rate; each rate may be substantially slower than the decay rate of the pulse that generated that eddy current. As each eddy current may itself induce a transient magnetic field gradient which can persist after the original input magnetic field gradient pulse has subsided to an essentially zero magnitude, then transient magnetic field gradients can be generated which persist into the time interval when chemical shift information is to be acquired. Such persistent transient magnetic field gradients can destroy the ability of the system to acquire the proper response information. For example, in three-dimensional (3-D) or four-dimensional (4-D) transform (FT) spectroscopic imaging, as described and claimed in the aforementioned U.S. Pat. No. 4,506,223, response data must be acquired in the absence of magnetic field gradients; in selective irradiation imaging methods, such as disclosed and claimed in the aforementioned co-pending application Ser. No. 561,381, and now U.S. Pat. No. 4,585,993 the nuclear magnetic resonance response signal from the selected chemical species must be excited in the absence of such magnetic field gradients. It is, therefore, critical to the performance of chemical shift spectroscopy and chemical shift spectroscopic imaging, that induced transient magnetic field gradients be ameliorated to the greatest degree possible, if not completely prevented. It is also desirable, even in the somewhat more-tolerant conventional NMR experiment, to reduce induced gradient magnetic fields to a minimum, as a higher inherent field homogeneity permits reduced data acquisition bandwidths, thereby providing improvements in the signal-to-noise ratio, and prevents the normally non-spatially-selective radio-frequency (RF) pulse signals from becoming spatially selective in the presence of any transient magnetic field gradients.

BRIEF SUMMARY OF THE INVENTION

In accordance with the invention, methods for reducing transient magnetic field inhomogeneity in NMR imaging and NMR chemical shift spectroscopic imaging by applying at least one form of cancellation gradient magnetic field pulse, include at least one pair of the steps of: (a1) providing a first form of cancellation pulse to the imaging volume during the presence of each non-selective radio-frequency (RF) pulse, i.e. any RF pulse normally provided when all imaging gradient magnetic fields have an essentially zero magnitude; and (a2) adjusting each first form cancellation gradient magnetic field pulse, if used, to an amplitude to provide as uniform an excitation RF magnetic field as possible across the imaging volume; (b1) providing a second form of cancellation gradient magnetic field pulse to the imaging volume immediately following any response signal readout time interval in which a non-zero amplitude imaging gradient magnetic field is present in the imaging volume; and (b2) adjusting at least one of the amplitude and time duration of the second form cancellation gradient magnetic field pulse, if used, to cancel the effect of the imaging readout field gradients prior to the start of a next-subsequent application of the entire imaging pulse sequence; (c1) providing a third form of cancellation gradient magnetic field pulse to the imaging volume immediately following any spatially-selective RF pulse, i.e. any RF pulse occurring during any time interval when any gradient field, not involved with initial slice selection, is used prior to the termination of any response signal readout time interval; and (c2) adjusting at least one of the amplitude and time duration of each third form cancellation gradient magnetic field pulse, if used, to cancel effects of readout time interval gradients interfering with data acquisition; (d1) providing a fourth form of cancellation gradient magnetic field if any gradient magnetic field is present when response data is being received; and (d2) adjusting at least one of the initial amplitude, time constant, wave shape and commencement time of each fourth form correction pulse, if used, to cancel the effect of any magnetic field gradient error; and (e1) providing a fifth form of cancellation gradient magnetic field pulse to the imaging volume at any time when completely orthogonal gradient magnetic fields are required; and (e2) adjusting at least one of the amplitude, decay time constant, waveshape and commencement time of each fifth form cancellation pulse to compensate at least the resultant X-direction and Y-direction gradients magnetic fields from any crosstalk therebetween.

In several presently preferred embodiments, each of the first, second and third form pulses are of constant amplitude during any application thereof and are of polarity opposite to that of the imaging gradient pulse which is to be compensated by that correction pulse. The fourth form pulses preferably occur at different times for each gradient direction, to compensate that gradient field for crosstalk induced therein by the other-axis gradient field not being precisely orthogonal to the desired axis direction.

Accordingly, it is one object of the present invention to provide novel methods for opposing and substantially cancelling any eddy current fields induced by transient magnetic field gradients.

This and other objects of the present invention will become apparent upon a reading of the following detailed description of the invention, when read in conjunction with the drawings.

BRIEF DESCRIPTION OF THE DRAWINGS

FIGS. 2–6 illustrate various cancellation signals utilized in each different presently preferred embodiment of the present inventive method for overcoming each of several different causes of transient magnetic field inhomogeneity.

DETAILED DESCRIPTION OF THE INVENTION

Figure 1:
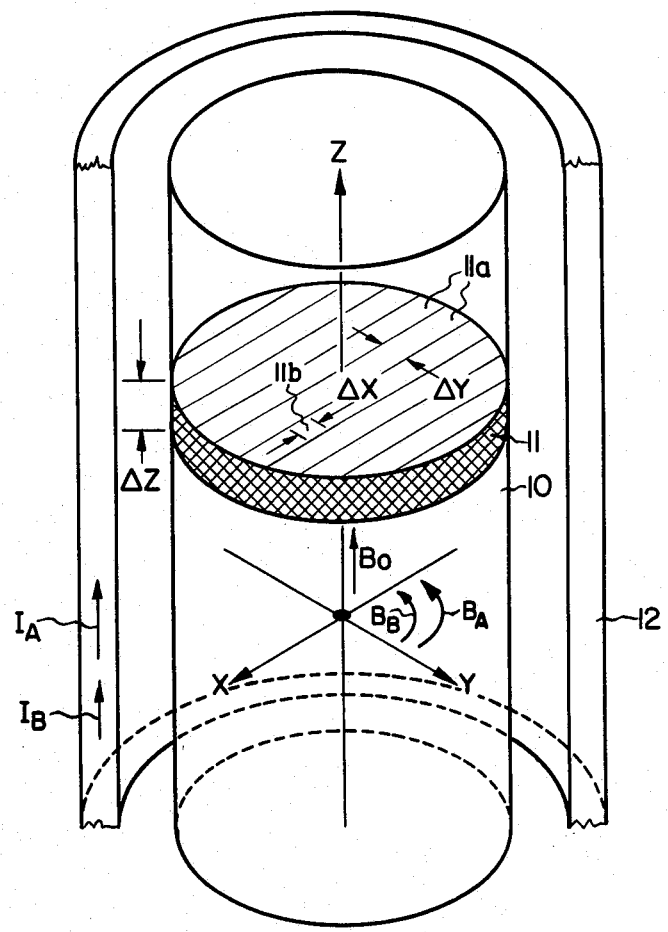
FIG. 1 is a schematic, sectional view of a portion of a NMR imaging apparatus and of a sample therein, and useful in defining several aspects of the general NMR experiment.

Referring initially to FIG. 1, a sample 10 is immersed in a static magnetic field $B_O$, which is directed along the illustrative cylindrical sample Z axis, of a three-dimensional Cartesian coordinate system. Gradients in the X, Y and/or Z directions can be utilized, in conjunction with radio-frequency (RF) excitation pulses at the proper Larmor frequency, to evoke NMR response signals from desired nuclei in a slice, or slab, portion 11 of the sample. Sample slice 11 has a thickness $\Delta Z$ in the Z direction; the slice 11 can be thought of as configured of sequential consecutive strips 11a, each having a width $\Delta Y$, with each of the strips containing a multiplicity of volume elements (voxels) 11b, of length $\Delta X$. The slice, strips and voxels of the sample are selected by suitable application of magnetic field gradients $G_Z$, $G_Y$, $G_X$, where $G_Z = \partial B_O / \partial Z$, $G_Y = \partial B_O / \partial Y$ and $G_X = \partial B_O / \partial X$.

The effective change in the total B field due to each gradient and to changing distance along the appropriate axis, is given by: $B = B_O + B_X + B_Y + B_Z$, where $B_X = G_X \cdot X$, $B_Y = G_Y \cdot Y$ and $B_Z = G_Z \cdot Z$.

The main static magnetic field $B_O$, the magnetic field gradients $G_X$, $G_Y$ and $G_Z$, and the necessary RF magnetic field excitation pulse signals are all provided by portions (not shown) of a field-forming means 12, which is generally positioned about the cylindrical sample volume 10. Means 12 may include: a superconducting (or resistive or permanent) magnet means for providing the static $B_O$ field, and used with or without superconducting and/or resistive shimming coils and/or passive magnetic shims for decreasing nonlinearities in the main $B_O$ field; magnetic field gradient-forming coil means; radio-frequency antennae; and the like, as well known to the art. As also well known to the art, a magnetic field portion $B_A$, which itself can be the result of a desired flow of current $I_A$ in means 12, can induce an eddy, or secondary, current contribution $I_B$ in an adjacent portion of a conductor, such as is found in means 12. The eddy current $I_B$ can be present at a non-zero magnitude at a time after the original magnetic field portion $B_A$ has decayed to an essentially zero magnitude. If present, the eddy current $I_B$ will itself generate a magnetic field portion, or gradient, $B_B$ within volume 10, possibly at a time which causes interference with the excitation of the NMR signal or with the desired NMR imaging response signal itself, from the slice 11 of excited nuclear spins of the sample.

In accordance with the invention, additional pulsed magnetic field gradients are provided to oppose and substantially cancel the induced eddy current fields $B_B$. The compensating gradient pulses include at least one of corrective magnetic field gradient pulses applied: during nonselective RF pulse signals; immediately subsequent to an initial magnetic field gradient application; during data acquisition time intervals; or during the presence of the magnetic field gradients themselves, to compensate for gradient-gradient crosstalk.

MAGNETIC FIELD GRADIENT CORRECTION SIGNALS, APPLIED DURING NON-SELECTIVE RF PULSES

Figure 2:
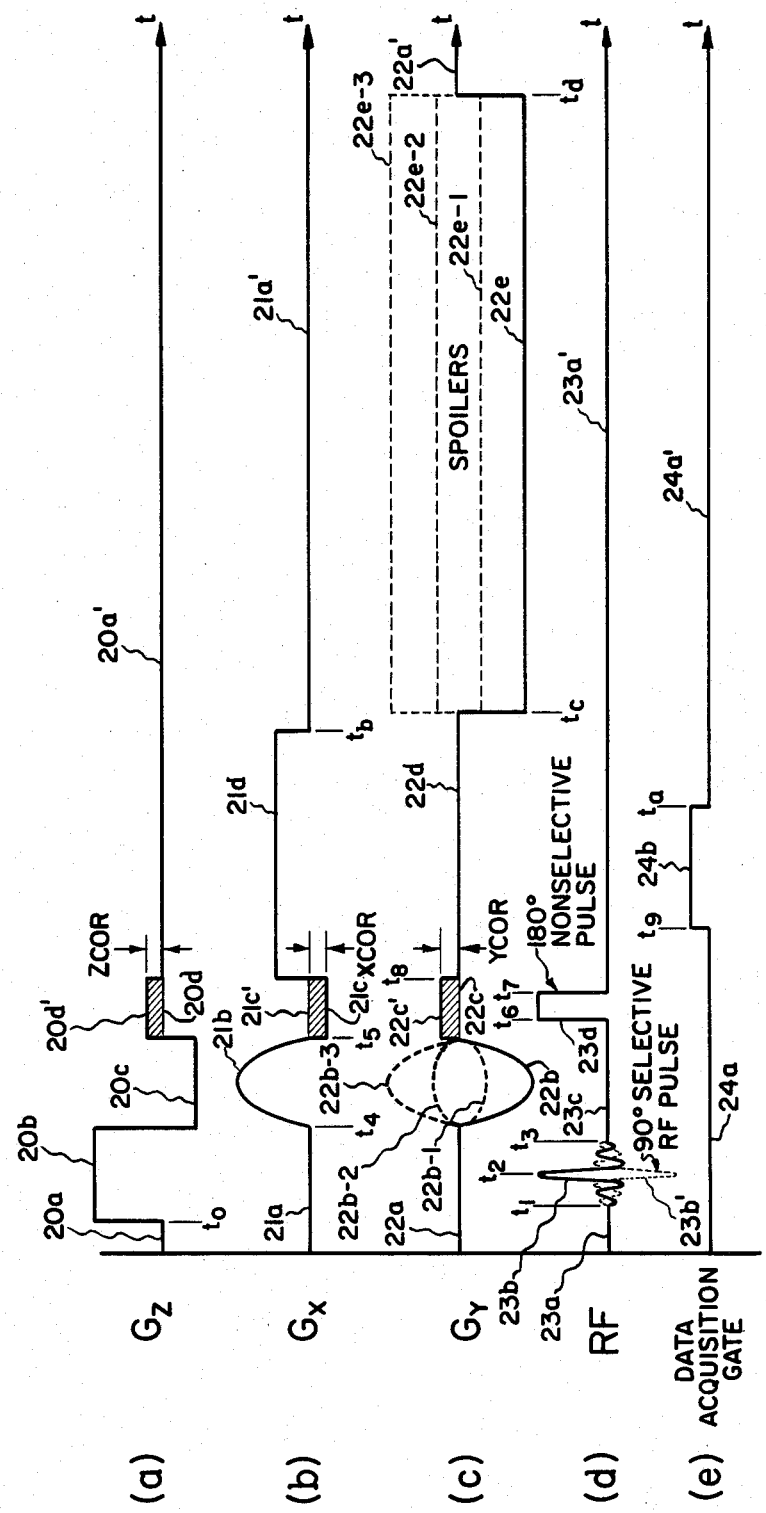

Referring now to FIG. 2, a first form of correction signal is provided, as part of each magnetic field gradient signal sequence applied along one of the three Cartesian coordinate system axes, to oppose and substantially cancel eddy current fields induced by non-uniformity of the radio-frequency (RF) magnetic field applied to non-selectively invert the spins of nuclei in that slice 11 to be imaged. In general, the effects of a non-uniform RF excitation field can be overcome by use of at least one substantially-constant-amplitude correction signal which is present during the non-selective RF signal pulse.

These correction signals will be illustrated as part of a spin-echo 2DFT sequence. The sequence commences with each gradient signal having an essentially zero-magnitude portion prior to commencement time $t_0$ (i.e. as shown by the Z-axis gradient $G_Z$ signal portion 20a, the X-axis $G_X$ gradient portion 21a and the Y-axis $G_Y$ portion 22a), along with a substantially zero-magnitude radio-frequency signal portion 23a, of respective portions (a), (b), (c) and (d) of FIG. 2. The imaging receiver has its data acquisition gate (FIG. 2, portion e) "closed", as shown by signal portion 24a.

The imaging sequence commences at time $t_0$, when the Z-axis gradient magnetic field rises to a magnitude, as in portion 20b, selected to determine the Z-axis midpoint of the slice at a desired distance from the coordinate system zero center defined in the sample imaging system. At some time $t_1$ shortly thereafter (when the value of gradient $G_Z$ has stabilized), a substantially 90° selective RF pulse 23b (or the inverse thereof, e.g. pulse 23b', as required by the necessary phasing for that particular sequence) is applied to nutate the spins in a selected slice through 90°. Pulse 23b or 23b' reaches its peak amplitude at time $t_2$ and is essentially finished at time $t_3$, prior to the time $t_4$ at which the Z gradient field slice-selection portion 20b ends. As is known, the selective RF pulse 23b or 23b' may have an envelope which is of the sinc-modulated, Gaussian-modulated or the like modulated envelope shape, to determine the slice thickness $\Delta Z$ and weighting, or edge "sharpness", thereof. As is also well known, in the time interval between time $t_4$ and time $t_5$, the Z-axis magnetic field gradient $G_Z$ may be supplied, as in rephasing portion 20c, with a polarity opposite to the polarity of portion 20b with an amplitude such that substantially $$\frac{1}{2}\int_{t_1}^{t_4} G_Z(t)dt = \int_{t_4}^{t_5} G_Z(t)dt.$$

During the same time interval, the Y-axis gradient $G_Y$ field can be applied with a peak amplitude chosen to spatially encode stripes 11a of voxels with a Y-axis value of lobular portion 22b (or of that one of portions 22b-1, 22b-2, 22b-3, . . . ) selected for that particular sequence; the X-axis $G_X$ gradient magnetic field is provided as a lobular portion 21b of peak amplitude sufficient to provide an NMR signal during data acquisition interval 24b in conjunction with RF pulse 23d and gradient portion 21d, as described in U.S. Pat. No. 4,471,306 issued Sept. 11, 1984 and assigned to the same assignee as the present invention. At time $t_5$, the pulsed gradient magnetic fields $G_Z$, $G_X$ and $G_Y$ signals are all essentially terminated; in the known spin-echo imaging sequence these signals would then be provided, in portions 20d, 20c and 22c, respectively, with essentially zero magnitude, such that the gradient magnitudes have definitely decayed to an essentially zero magnitude by the time $t_6$ at which a non-selective 180° RF pulse 23d is applied to the sample. However, if at least one of the gradient signal portions 20c, 21b or 22b, during the time interval between times $t_4$ and $t_5$, has induced an eddy current, the eddy current may itself provide an undesired, disturbing magnetic field gradient during the time interval from time $t_5$ to $t_8$, and especially during the time interval from time $t_6$ to $t_7$ when non-selective RF pulse 23d is present. The presence of a non-zero gradient field during pulse signal portion 23d will cause a non-uniform excitation RF field to be present across at least part of the imaging volume and will, accordingly, deleteriously limit the imaging information in a direction related to that one of the axes then having a non-zero gradient magnetic field therealong.

In accordance with one aspect of the present invention, the eddy current-induced gradient magnetic fields present during a non-selective RF pulse are opposed and substantially cancelled by means of at least one gradient-compensating correction pulse. A first correction gradient magnetic field signal pulse 20d'' can be provided, during the time interval between times $t_5$ and $t_8$, in the Z-axis $G_Z$ gradient magnetic field signal. The Z-axis correction pulse 20d'' is provided with an amplitude ZCOR and polarity selected to provide as uniform an excitation RF field as possible in the Z-direction responsive to the associated non-selective RF signal pulse 23d. Similarly, an X-axis $G_X$ gradient magnetic field correction signal pulse 21c' can be provided with an amplitude XCOR, and a Y-axis $G_Y$ gradient magnetic field correction signal pulse 22c' can be provided with a magnitude YCOR. The values ZCOR, XCOR and/or YCOR are each adjusted such that the amplitude level (and polarity) of that gradient field correction pulse, which is at an essentially stable value between times $t_6$ and $t_7$, is that amplitude (and polarity) necessary for opposing and substantially cancelling the eddy current-induced gradient magnetic field component along the associated coordinate axis. The correction signal amplitude XCOR, YCOR or ZCOR of portions 20d'', 20c' or 22c', respectively, can each be adjusted to optimize the uniformity of excitation of the 180° non-selective RF pulse 23d, by adjusting for the maximum magnitude of the spin-echo response signal appearing during the time interval, from time $t_9$ to time $t_a$, when the X-axis $G_X$ readout gradient magnetic field portion 21d is present and the data acquisition gate is open, as shown in portion 24b. It will be understood that if an eddy-current-induced gradient is not present along a particular axis during the non-selective RF signal pulse time interval between time $t_6$ and time $t_7$, then the corresponding pulse is not required (or, said in another fashion, has an essentially zero magnitude). It will be seen that the correction pulse signals 20d'', 21c' and 22c' have fallen to an essentially zero magnitude at a time $t_8$ after the end of the non-selective RF pulse (at time $t_7$) and prior to the start of the data acquisition time interval (at time $t_9$). The remainder of the sequence, including the reduction of the X-axis readout gradient, at time $t_b$, to the substantially zero initial value (as shown by portion 21a'), the return of the $G_Y$ gradient magnetic field to an essentially zero magnitude (in portion 22a') with or without the presence of a spoiler portion 22e used for randomizing any residual transverse NMR magnetization (or one of portions 22e-1, 22e-2, 22e-3, . . . ), the substantially zero RF signal amplitude in portion 23a', and the closure of the data acquisition gate, as in portion 24a', are well known to the art.

It will be seen that, for this first presently preferred embodiment of my method for correcting the effects of eddy current-induced gradient magnetic field errors, the amplitudes, polarity and duration of the at least one correction signal (and typically a correction signal along each of the three coordinate axes of the coordinate system selected for use) present during each occurrence of a non-selective RF pulse, are selected to oppose and substantially cancel the induced eddy current magnetic field gradients.

MAGNETIC FIELD GRADIENT CORRECTION SIGNALS, APPLIED IMMEDIATELY SUBSEQUENT TO AN INITIAL GRADIENT APPLICATION

Figure 3:
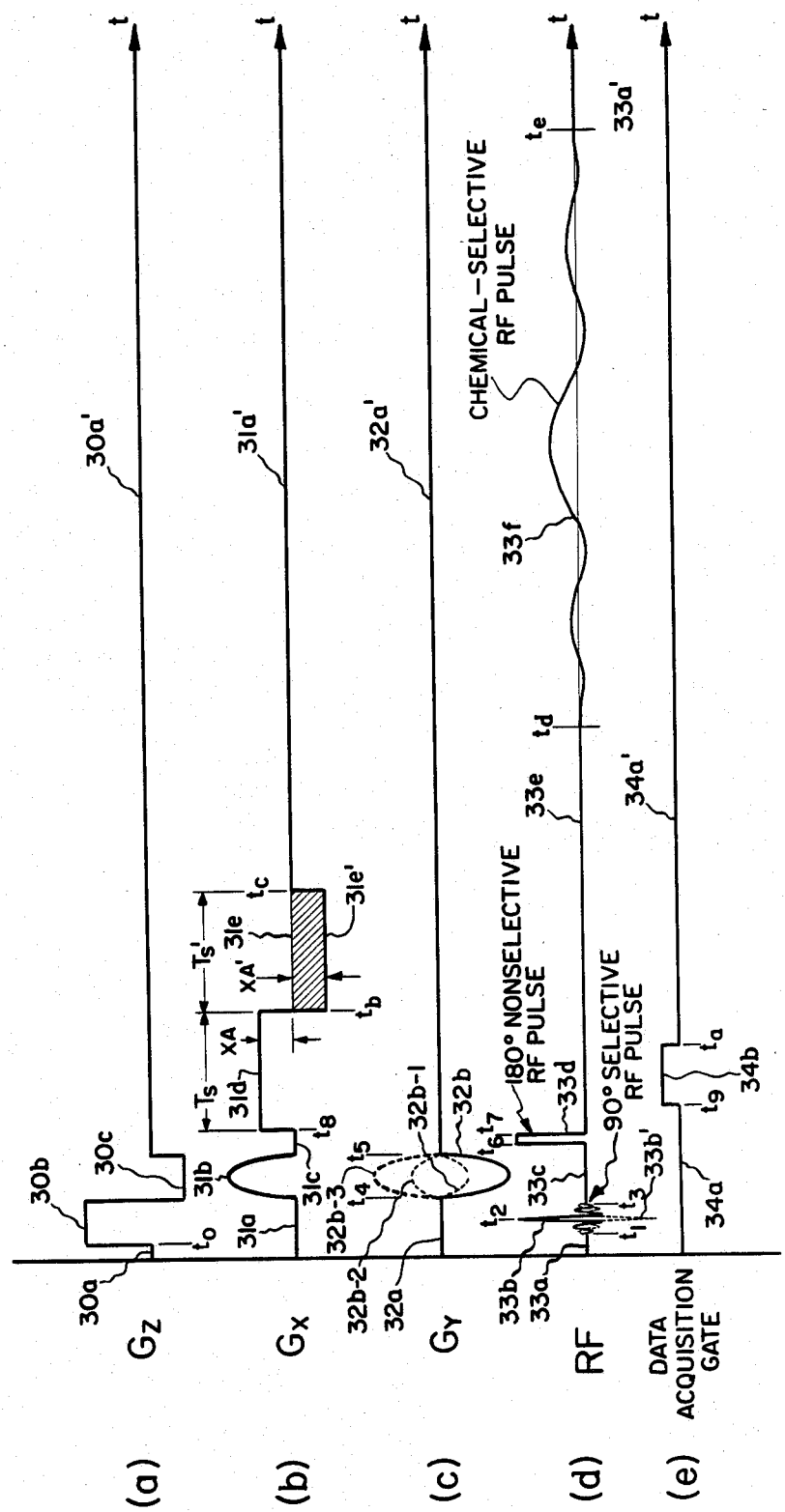

Referring now to FIG. 3, a second form of correction signal is provided, as part of each magnetic field gradient signal sequence applied along at least one of the three Cartesian coordinate system axes, to oppose and substantially cancel any deleterious magnetic field responsive to an eddy current induced by a non-selective RF pulse. Thus, the eddy-current-cancelling correction signal can only be applied when the correction signal will not interfere with any data acquisition portion of the imaging sequence.

This second form of correction signal is illustrated as part of an NMR chemical shift spectroscopy imaging sequence, wherein a narrow bandwidth RF magnetic field must be applied to the sample in the absence of any magnetic field gradient to selectively irradiate a particularly chemical-shift resonance to suppress that resonance from a desired chemical-shift spectrum response signal. The sequence will be seen to be, at least in its initial portions, similar to the spin-echo 2DFT sequence of FIG. 2. Thus, the sequence commences with each gradient signal having an essentially zero-magnitude portion prior to commencement time $t_0$ (e.g. the zero-magnitude Z-axis gradient $G_Z$ signal portion 30a, the X-axis gradient $G_X$ portion 31a and the Y-axis gradient $G_Y$ portion 32a), along with a substantially zero-magnitude RF signal portion 33a, in respective portions (a), (b), (c) and (d) of FIG. 3. The system receiver has a "closed" data acquisition gate signal portion 34a (portion e of FIG. 2) and is therefore initially disabled from receiving any response signals.

The imaging sequence, commencing at time $t_0$, performs, at least through time $t_5$, in the same manner as the sequence of FIG. 2. In fact, the sequence through time $t_b$ performs in substantially identical manner to the performance of the non-corrected sequence described with respect to FIG. 2. However, this original sequence, while having a substantially zero-magnitude portion 31e for the X-axis gradient $G_X$ signal at the end of the read-out gradient portion 31d, includes a chemical-selective RF pulse portion 33f. The chemical-selective pulse signal 33f is a narrow bandwidth RF pulse which must be applied in the absence of a magnetic field gradient to selectively irradiate at least one undesired chemically-shifted resonance, such that the selected resonance(s) can be suppressed from the chemical-shift spectrum information obtained in the initial portions of the next-subsequent application of the data-collection sequence. These eddy-current-induced magnetic field gradient(s) could be compensated for by utilizing the XCOR, YCOR and ZCOR correction signals applied during the time interval from time $t_d$ to time $t_e$ (described with reference to FIG. 2), to limit each eddy-current-induced gradient field value to less than the value of the maximum tolerable induced gradient along the associated axis; however, a typical narrow-bandwidth chemical-selective irradiation pulse is of relatively long duration, e.g. at least one hundred milliseconds, so that the eddy currents excited by the non-selective pulse may decay during this relatively long pulse interval whereby a properly adjusted correction pulse provided prior or at time $t_d$ could lead to incorrect compensation by the end of pulse 33f at a much later time $t_e$. Thus, I prefer to utilize a compensation signal provided prior to the time $t_d$ at which the chemical-selective RF pulse commences.

In accordance with a second aspect of the present invention, undesirable gradient magnetic fields, responsive to eddy-currents induced during a non-selective RF pulse, are opposed and substantially cancelled by means of at least one gradient-compensating correction pulse applied immediately subsequent to an initial application of an associated gradient magnetic field. In FIG. 3, the illustrated signal sequence assumes compensation is required only for one gradient magnetic field, e.g. the X-axis gradient magnetic field $G_X$; it should be understood that similar corrections for the other two gradient magnetic fields, e.g. the Y-axis gradient magnetic field $G_Y$ and/or the Z-axis gradient magnetic field $G_Z$, could not be provided in the FIG. 3 sequence prior to time $t_a$ since the existence of corrections of this type prior to the data acquisition portion 34b would deleteriously interfere with the desired NMR signal to be obtained in that time interval between time $t_9$ and time $t_a$. Accordingly, the eddy currents to be compensated for here are those persisting after time $t_a$, and any corrective actions must be taken subsequent to the data acquisition interval. The $G_X$ imaging gradient portion 31d is present with some amplitude XA during a time interval of duration $T_s$, commencing at time $t_8$ and terminating at time $t_b$. An eddy-current induced by this portion can be opposed and substantially cancelled by means of a subsequent gradient-compensating correction pulse 31e' in each of the associated gradient fields (here, only the X-axis field), in accordance with another aspect of the present invention. Correction pulse 31e' has an amplitude XA' substantially equal to the amplitude XA of the gradient magnetic field pulse 31d applied substantially immediately prior to the compensation pulse. The polarity of gradient correction pulse 31e' is that polarity necessary to allow pulse 31e' to "suck out" the tainting effects of the previously induced eddy-current(s) and is typically opposite to the polarity of the readout pulse 31d. Compensation pulse 31e' thus has a time duration $T_s'$ (commencing at time $t_b$ and terminating at time $t_c$) typically less than or equal to the time duration $T_s$ of the pulse 31d being compensated for and is adjusted to cancel the effects of pulse 31d and so provide a uniform field during application of the chemical selective pulse 33f. However, pulse 31e' must terminate prior to the application of the chemical-selective RF pulse 33f which commences at time $t_d$.

It will be seen that, for this second presently preferred embodiment of my method for correcting the effects of eddy-current-induced gradient magnetic field errors, that the amplitude, polarity and duration of the at least one correction (or "sucker") signal, which is provided substantially immediately subsequent to an initial application of an associated magnetic field gradient, is selected to oppose and substantially cancel the deleterious effects in the associated magnetic field gradient, responsive to the associated error-inducing eddy current.

MAGNETIC FIELD GRADIENT CORRECTION SIGNAL, APPLIED IMMEDIATELY AFTER A GRADIENT MAGNETIC FIELD PRESENT DURING A SELECTIVE 180° RF PULSE

Figure 4:
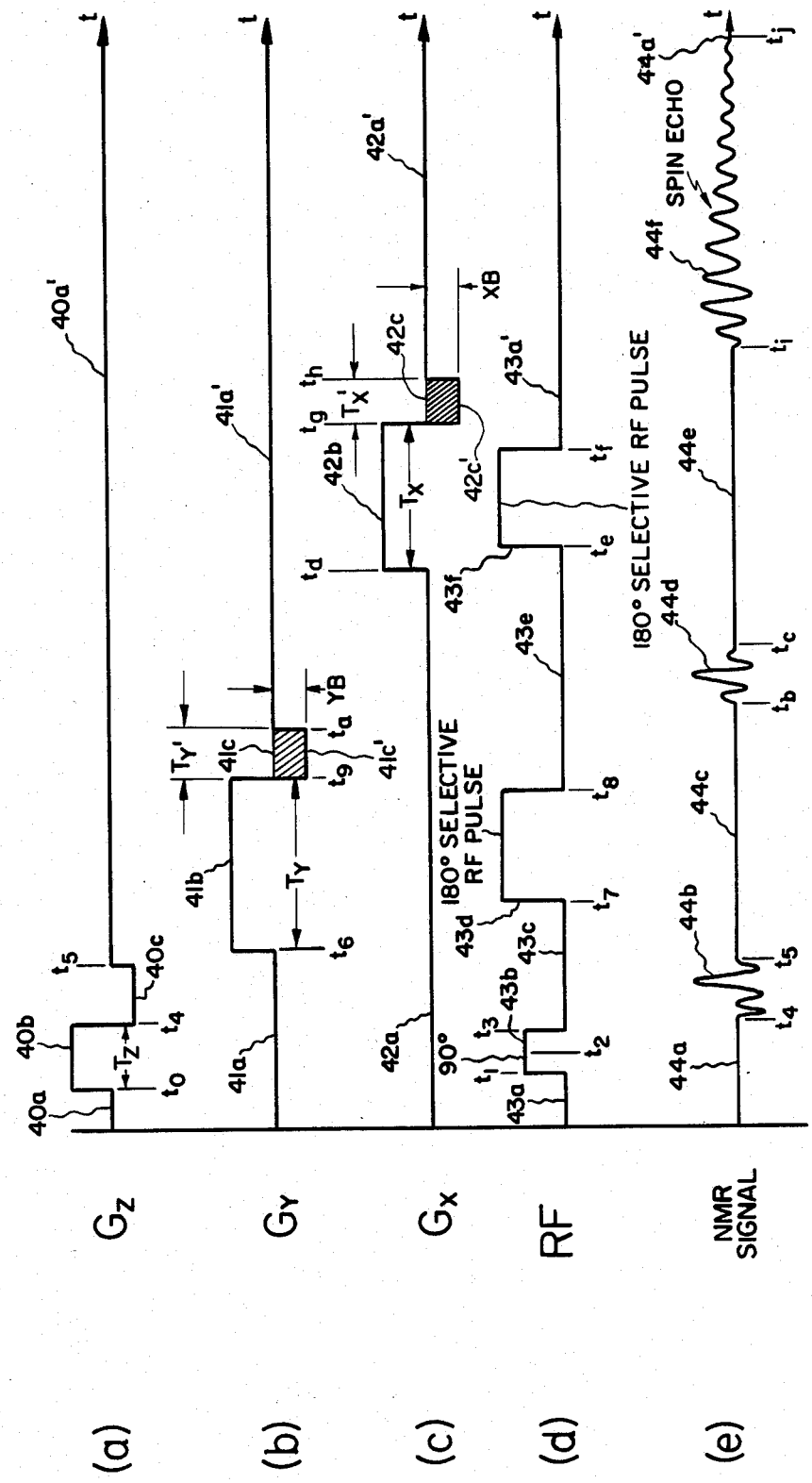

Referring now to FIG. 4, a third form of correction signal is provided, as part of each magnetic field gradient signal sequence applied along at least one of the three Cartesian coordinate system axes, to oppose and substantially cancel an error induced in a gradient magnetic field by an eddy current itself caused by the temporal asymmetry of that gradient magnetic field present during a 180° selective RF pulse. Normally, the gradient magnetic field applied during a slice-selective 180° (or $\pi$-radian) RF pulse is desirably time-symmetrical about the temporal center of that selective pulse. However, due to real physical properties of the means generating the gradient magnetic field, it is possible for the gradient magnetic field rise time to be different from the gradient magnetic field fall time, or for other, similar temporal non-symmetries to occur. Generally stated, it is possible that the time interval required for the gradient magnetic field to increase from its rest value to its maximum value is not equal to the time interval required for the gradient magnetic field to decrease from the maximum value to the same rest value. It is desirable to compensate for time-amplitude asymmetry by applying a compensating gradient magnetic field pulse, of opposite polarity to the slice-selective gradient magnetic field, and with a combination of time interval and amplitude selected to compensate for the asymmetry and additionally reduce eddy current gradients which would otherwise persist into subsequent sample excitation or response signal data acquisition time intervals.

These correction signals are illustrated as part of a localized chemical-shift imaging sequence. Prior to the actual sequence commencement, the three gradient signals, the RF signal and the NMR response signal are all at a substantially zero level, as shown in respective portions 40$a$, 41$a$, 42$a$, 43$a$, and 44$a$, of portions ($a$)–($e$) of FIG. 4. When the imaging sequence commences at time $t_o$, the Z-axis gradient magnetic field $G_Z$ rises to a slice-selection magnitude, in portion 40$b$, at the start of a Z-axis gradient time interval $T_Z$, from time $t_0$ to time $t_4$; during this time interval a 90° RF pulse 43$b$ occurs, determining the Z-axis midpoint position and spread $\Delta Z$ of the slice for which a chemical-shift image is to be provided. It should be understood that non-zero portions of the RF excitation signal (portion ($d$) of FIG. 4) are shown as "transmission gated" functions herein, although modulation by a non-rectangular envelope function (such as the sinc-function modulation depicted as 33$b$ in FIG. 3) during these gated-on time intervals is more common. A re-phasing portion 40$c$ is provided in the Z-axis magnetic field gradient $G_Z$, between time $t_4$ and time $t_5$; a response signal portion 44$b$ may occur responsive to re-phasing portion 40$c$, but is ignored. At a slightly later time $t_6$, a Y-axis selective gradient $G_Y$ portion 41$b$ is provided for a time interval $T_Y$, e.g. until time $t_9$. During this time interval a 180° selective RF pulse 43$d$ is provided, to select a Y direction stripe 11$a$ from which data is to be acquired. Normally, a X-axis gradient magnetic field $G_X$ portion 42$b$ is then provided, during a time interval $T_X$ starting at a time $t_b$ and ending at a time $t_g$, wherein a second 180° selective RF pulse 43$f$ is provided, to select the X-axis location of the voxel 11$b$ along the Y stripe 11$a$ selected by gradient portion 41$b$. It is this voxel from which the localized chemical-shift image data will be provided as a response spin-echo signal 44$f$, responsive to this repetition of the imaging sequence. However, if either of the gradient magnetic field portions 41$b$ or 42$b$ are temporal asymmetric, especially during the respective time interval (from $t_7$ to $t_8$ or from $t_d$ to $t_e$, respectively) when the associated 180° selective RF pulse 43$d$ or 43$f$, respectively, is present, compensation for such temporal asymmetry can be provided at the same time that eddy-current compensation is provided by a compensation pulse following immediately subsequent to an initial application of the associated gradient magnetic field.

In accordance with another aspect of the present invention, each gradient magnetic field signal present during a selective 180° pulsed RF magnetic field is followed by an opposite-polarity compensation gradient pulse provided along that same axis of the field system. The compensation gradient signal has an amplitude and duration selected to oppose and substantially cancel any asymmetry in the gradient signal applied during the selective time interval. Accordingly, in the illustrative example, any asymmetry in the Y-axis gradient magnetic field $G_Y$ portion 41$b$ is compensated for by applying a gradient signal portion 41$c'$, substantially immediately thereafter, in the time interval $T_Y'$ (from time $t_9$ to time $t_a$), with a polarity (e.g. negative polarity) opposite to the polarity of gradient field pulse 41$b$, and with an amplitude YB selected to oppose and substantially cancel the effect of the Y gradient field asymmetry. The asymmetry correction pulse 41$c'$ terminates prior to the time at which a next pulse (or set of pulses) is applied to any gradient field axis, e.g. before the time $t_d$ when the X-axis gradient magnetic field $G_X$ portion 42$b$ commences. In practice, the amplitude and duration of the compensating pulse are adjusted to maximize the corresponding echo signal refocused by the respective 180° selective RF pulse signal, e.g. amplitude YB and duration $T_Y'$ are adjusted to maximize the echo signal 44$d$. It will be seen that any asymmetry effects in this X-axis pulse 42$b$, in conjunction with the associated 180° selective RF pulse 43$f$, are compensated for by a compensation pulse 42$c'$. This compensation pulse 42$c'$ commences at a time $t_g$ at which the pulse (e.g. pulse 42$b$) to be compensated for terminates and lasts for a time interval $T_X'$ (e.g. from time $t_g$ to time $t_h$); pulse 42$c'$ has an amplitude XB and a polarity selected to oppose and substantially cancel any gradient asymmetry along the associated axis (e.g. the X-axis). One, or any combination, of the compensation pulses 41$c'$, 42$c'$, . . . also perform the additional function of reducing eddy current gradients which may persist into subsequent sample excitation or response signal data acquisition time intervals. Because these compensation pulses, e.g. compensation pulse 42$c'$, occur during the evolution of the NMR response signal and prior to data acquisition (e.g. in the interval from time $t_f$ and time $t_i$), extreme care in setting of the compensation pulse parameters must be exercised, to prevent excessive disturbance of the response signal, and subsequent loss of response data.

It will be seen, for this third presently preferred embodiment of my method for correcting the effects of induced gradient magnetic field errors, that the amplitude, polarity and duration of the at least one correction signal, which is provided substantially immediately subsequent to an initial application of an associated magnetic field gradient, is selected to oppose and substantially cancel the deleteriously effects in the associated magnetic field gradient, responsive at least to the associated temporal asymmetry of that magnetic field gradient application.

MAGNETIC GRADIENT FIELD CORRECTION SIGNAL, APPLIED DURING DATA ACQUISITION

Figure 5:
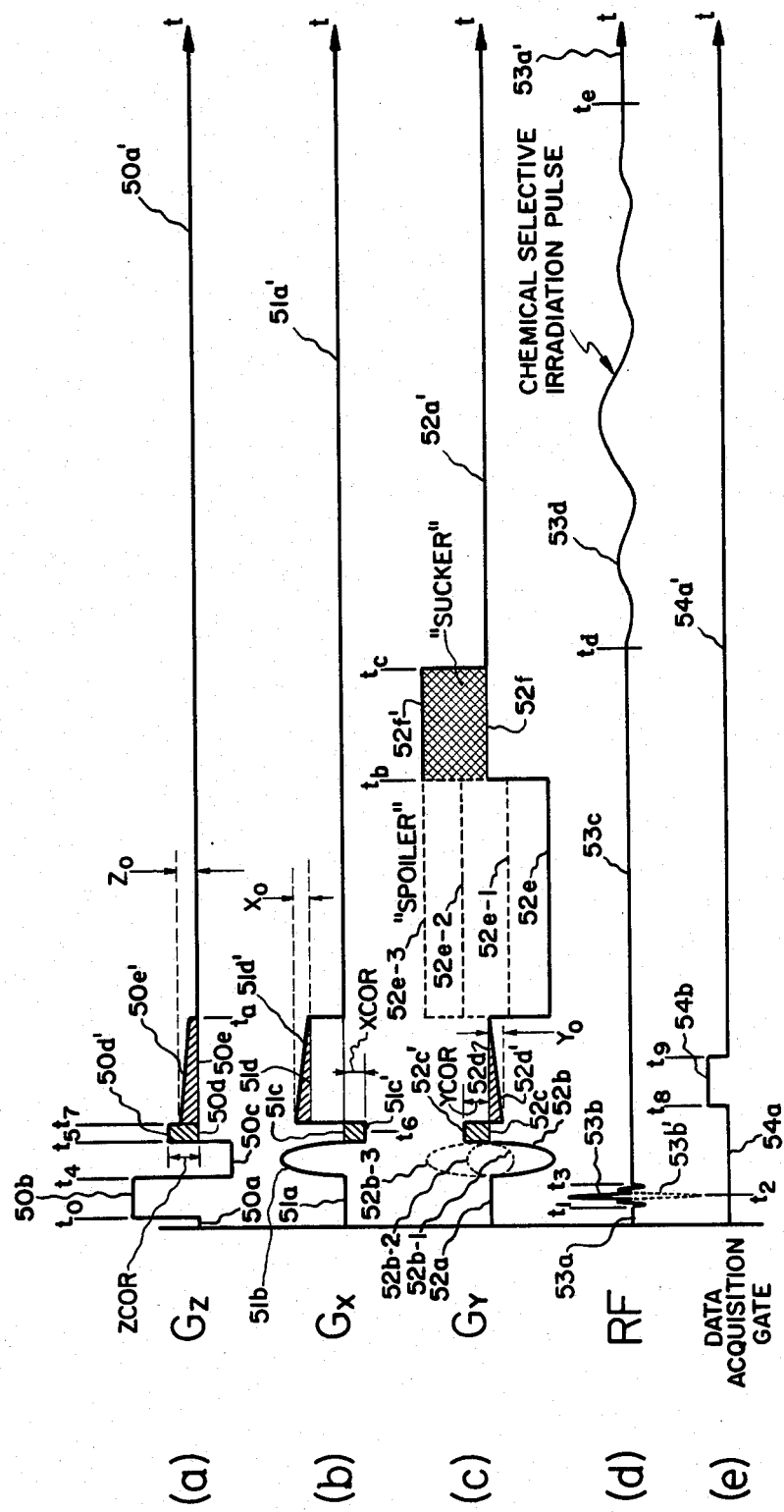

Referring now to FIG. 5, still another form of correction signal is provided, as part of each magnetic field gradient signal sequence applied along each of the three Cartesian coordinates system axes, to oppose and substantially cancel any time-varying eddy current gradients present during a data acquisition time interval. This particular form of eddy-current-cancelling correction signal will, therefore, be applied only during a response data acquisition portion of an imaging sequence.

This form of correction signal is illustrated as part of a chemically-selective planar 2DFT imaging sequence, wherein (as in the signal sequence of FIG. 3) a narrow bandwidth RF magnetic field is applied to the sample in the absence of any magnetic field gradient to selectively irradiate a particular chemical-shift resonance to suppress that resonance from the response signal and thereby generate an image of a selected chemically shifted species. The sequence will be seen, in the portions from commencement time $t_0$ through time $t_5$, to be similar to the 2DFT sequences previously discussed. It will also be seen that, in the time interval between time $t_5$ and time $t_7$, the otherwise essentially-zero levels of each of the three respective gradient $G_Z$, $G_X$ and $G_Y$ portions 50d, 51c and 52c are replaced with respective gradient correction pulse portions 50d', 51c' and 52c' of respective amplitudes ZCOR, XCOR and YCOR. The correction pulses are thus applied during the time interval immediately subsequent to the initial gradient application (which itself occurs in the time interval prior to time $t_5$). In the data acquisition interval, when the data acquisition gate is "closed", (between times $t_8$ and $t_9$, as shown in portion 54b of FIG. 5, portion (e)), proper data acquisition requires the presence of a homogeneous magnetic field so that chemical-shift spectral information is not lost. Therefore, eddy-current-correcting magnetic field pulses are usually not applied during the data acquisition time interval, to prevent the alteration of phase information contained in the NMR response signal, which alterations will have deleteriously effects upon the imaging properties of the gradient pulse sequence utilized.

In accordance with still another aspect of the present invention, the undesirable gradient magnetic fields, present during response signal data acquisition responsive to eddy-currents induced prior to the data acquisition time interval, are opposed and substantially cancelled at least during the data acquisition time interval by adding a gradient-compensating correction pulse signal to at least one of the imaging magnetic field gradients, at least during the data acquisition time interval. Each correction pulse has a polarity opposite to the polarity of the associated gradient error to be compensated for, and has a time-varying amplitude established to substantially cancel the effect of the time-decaying eddy-current-induced gradient during that data acquisition time interval. Thus, in FIG. 5, the illustrated signal sequence collects response signal data for all voxels in the selected plane, spatially resolved in the X-direction by virtue of the non-zero X-axis gradient magnetic field $G_X$ spatial-encoding portion 51d. The respective Z-axis and Y-axis gradient magnetic fields $G_Z$ and $G_Y$ should have respective essentially-zero amplitudes, as in respective portions 50e and 52d. Thus, prior to time $t_8$, at the beginning of the data acquisition time interval, each pre-existing eddy current (being caused by a gradient field variation occurring prior to time $t_7$) is exponentially decaying, generally with a different time constant for that field component parallel to each different one of the coordinate system axes (responsive to the unavoidable inhomogeneities, in that axis direction, in the investigatory sample, the investigation system and the like). In order to substantially correct the gradients during the data acquisition time interval (i.e. when the non-zero acquisition gate signal 54 is present), I presently prefer to start the compensatory gradient field correction signals at time $t_7$, prior to the commencement of the data acquisition time interval, and continue the compensatory signals until a time $t_a$ after the termination, at time $t_9$, of the data acquisition gating signal. Thus, the Z-axis gradient magnetic field $G_Z$ is provided with a first gradient correcting signal portion 50e', having an initial amplitude $Z_0$, a time constant $T_Z$ and a polarity (e.g. positive polarity) selected such that the time-varying eddy-current-induced field is opposed and substantially cancelled (and the desired, e.g. essentially zero, amplitude is obtained) at least during the time interval of gate signal 54b. Similarly, the desired (e.g. essentially zero) amplitude of the Y-axis gradient magnetic field $G_Y$ portion 52d is provided by utilization of a compensation signal pulse portion 52d', having a polarity (e.g. negative polarity), an initial amplitude $Y_0$ and a time constant $T_y$ all selected to cause the actual Y-axis gradient field to have the substantially zero amplitude assumed for portion 52d. Because the X-axis gradient magnetic field $G_X$ is to have a non-zero, but substantially constant, value $G_{Xk}$ (represented by the amplitude of the positive-polarity gradient magnetic field portion 51d), then any decaying eddy-field-induced gradient field error portion must be compensated for by an additional time-decaying portion 51d', itself having an initial polarity, an initial amplitude $X_0$ and a time constant $T_X$ all selected to cause the actual X-axis gradient magnetic field within the sample to have a substantially constant actual magnitude during the data acquisition time interval.

During the time interval from the time (e.g. time $t_7$) at which each correction signal is applied until the time (e.g. time $t_a$) at which each correction pulse signal is removed, each of the correction gradient magnetic fields $G_X'$, $G_Y'$ and $G_Z'$ is of the form:

$$G_{X'} = X_O \exp(-(t - t_7)/T_X) \Big|_{t = t_7}^{t = t_a} \qquad (1)$$

$$G_{Y'} = Y_O \exp(-(t - t_7)/T_Y) \Big|_{t = t_7}^{t = t_a} \qquad (2)$$

$$G_{Z'} = Z_O \exp(-(t - t_7)/T_Z) \Big|_{t = t_7}^{t = t_a} \qquad (3)$$

These correction terms are added to any non-zero constant amplitude gradient fields so as to generate net applied magnetic field gradients $G_X$, $G_Y$, and $G_Z$ during this time interval. Thus in the illustrative sequence, the X-axis field $G_X$ is $$G_X = G_{Xk} + X_O \exp(-(t - t_7)/T_X) \Big|_{t = t_7}^{t = t_a} \qquad (1a)$$

whereas $G_Y = G_{Y'}$ and $G_Z = G_{Z'}$ in the same interval.

It should be understood that for a different sample, or even for different placement of the same sample within the gradient field system, the initial amplitude, polarity and/or time constant of at least one of the three gradient magnetic field correction signals may require modification to provide the required degree of compensation for the undesired eddy-current-induced error gradients. It will also be seen that, upon termination of the time-varying compensation gradient signal pulses, e.g. as at time $t_a$, additional portions of each imaging sequence can be provided; these additional portions can include "spoiler" portions 52e, 52e-1, 52e-2, 52e-3, ... having amplitudes established by the amplitude of an associated lobular portion 52b, 52b-1, 52b-2, 52b-3, ... of the stripe phase-encoding gradient utilized; eddy-current-compensating "sucker" pulses, e.g. pulse 52f', thereafter, but prior to subsequent selective signals; chemical-selective irradiation pulses, such as the suppression pulse 53d; and the like.

It will be seen for this fourth presently preferred embodiment of my method for correcting the effects of induced gradient magnetic field errors, that the polarity, amplitude and time constant of at least one correction signal, which is present during at least the entirety of that time interval during which a sample response signal is received and gated to allow action thereupon by the NMR system and subsequent to an application of any associated magnetic field gradient, is selected to oppose and substantially cancel the deleterious effects in that associated magnetic field gradient.

MAGNETIC FIELD GRADIENT CORRECTION SIGNAL, FOR INTER-GRADIENT CROSS-TALK COMPENSATION

Referring now to FIG. 6, a fifth form of correction signal is provided, as part of each magnetic field gradient signal sequence applied along at least one pair of the Cartesian coordinate system axes, to oppose and substantially cancel an error induced in a gradient magnetic field by cross talk between the means utilized for forming the gradient magnetic fields along the involved pair of axes. The gradient magnetic fields along each pair of axes are defined as orthogonal to one another. However, real physical means for forming the pair of gradient fields (such as pairs of coils and the like) may generate a pair of gradient magnetic fields which are non-orthogonal. The non-orthogonality causes a gradient-magnetic-field-inducing current in one portion of the (coil) generating means to induce not only a gradient along the desired axis, but also an undesired gradient portion along the orthogonal axis, thus altering the gradient value along that orthogonal axis and degrading, distorting or confusing the spatial imaging information to be obtained. This "cross-talk" between the means generating each field along each axis of the gradient magnetic field system will be seen to be perhaps the only one of the problems described herein which can be completely alleviated by physical reconstruction of the involved gradient-field-forming means. However, it may often be prohibitive, in terms of time and/or cost, to provide a permanent physical solution to the non-orthogonality problem, whereby a corrective gradient signal solution is desirable.

In accordance with another aspect of the present invention, a gradient magnetic field having a cross-talk contribution thereto from another gradient magnetic field to the field system, is individually compensated by application of a correction pulse signal of amplitude, waveshape and polarity selected to oppose and substantially eliminate the cross-talk-induced field portion. The corrective gradient signal may vary proportional to the gradient field acting as the cross-talk source, when that source gradient field is changed in signal characteristics, e.g. amplitude, signal shape, polarity, and the like.

The cross-talk correction signals are illustrated as part of a 2DFT imaging sequence, similar to the imaging sequence of FIG. 2 except with respect to the compensating gradient field pulses along X and Y axes. It will be seen that, during the phase-encoding time interval from time $t_4$ to time $t_5$, there is cross-talk from the Y-axis gradient magnetic field $G_Y$ lobular portion 62b to the X-axis gradient magnetic field $G_X$ desired lobular portion 61b. The illustrated cross-talk effect is a subtractive phenomenon (although it should be clearly understood that an additive effect may equally as well obtain), whereby the actual X-axis gradient-forming signal must be of greater-than-expected amplitude, so that an increased amplitude portion 61b' is utilized. Because the means typically utilized for forming a gradient magnetic field (e.g. gradient coils and the like) have time constants which are generally shorter than the time constants of eddy-current fields induced in a physically larger magnet structure, the cross-talk time constants themselves will be relatively short (generally on the order of one millisecond) whereby a constant-magnitude correction signal cannot be utilized. Accordingly, the cross-hatched portion between desired signal portion 61b and actually-utilized portion 61b' indicates that a time-varying cross-talk correction signal pulse, of maximum amplitude XC, is required to compensate for this particular portion of the cross-talk phenomenon. It should also be understood that the correction of cross-talk effects will not proceed in a single direction, as may be implied by the figure, because the non-orthogonality is typically a reciprocal relationship, whereby the corrective addition signal in the X-axis gradient-field-forming signal portion 61b' will typically affect the magnitude of the Y-axis gradient magnetic field $G_Y$. However, the effect of each axis signal upon the field along the other axis can be estimated and utilized, if the complex magnitude of the cross-talk between the two axis directions is initially established by imaging of a phantom array and the like. In this manner, the presence of a signal along one system axis, such as the X-axis gradient magnetic field $G_X$ portion 61d present during data acquisition (between at least times $t_9$ and $t_a$), can have an effect upon the Y-axis gradient magnetic field $G_Y$ portion 62c, which is ideally of zero magnitude during the same time interval, and which effect can be actually compensated for by the short-time-constant cross-talk compensation pulse signal portion 62c'. Thus, the amplitude, polarity and time constant of this cross-talk compensation pulse can be empirically established to oppose and substantially cancel the cross-talk effect of a gradient field signal along each axis and due to the gradient field signal along each remaining different one of the axes.

Several presently preferred methods for (1) providing at least one correction pulse signal during, or after, any application of the desired magnetic field to the sample to be investigated in a nuclear magnetic resonance system, and (2) adjusting at least one of the amplitude, polarity, time constant, time duration or the like characteristics of that correction pulse signal, to oppose and substantially cancel an error-producing portion of the total magnetic field gradient, have been described in some detail herein by way of explanation of my invention. Many modifications and variations will now become apparent to those skilled in the art. It is my intent, therefore, to be limited only by the scope of the pending claims and not by the specific presently peferred embodiments presented by way of explanation herein.

What I claim is:

1. A method for reducing transient inhomogeneities in at least one gradient magnetic field utilized in a nuclear magnetic resonance (NMR) system for investigation of a sample, comprising the steps of:

(a) providing a gradient magnetic field system having a gradient component along each of a plurality of mutually orthogonal axes;

(b) providing at least one correction pulse signal in a selected time interval, beginning not later than the commencement of the application to the sample of a selected magnetic field to be compensated for and terminating not sooner than the termination of the selected magnetic field to be compensated for; and (c) adjusting at least one of the correction pulse signal characteristics to oppose and substantially cancel an error-producing portion of the magnetic field gradient along an associated one of said gradient magnetic field system axes.

2. The method of claim 1, wherein the magnetic field to be compensated for is one of a radio-frequency magnetic field and a gradient magnetic field.

3. The method of claim 2, wherein steps (b) and (c) are independently utilized for a gradient along each of a plurality of the system axes.

4. The method of claim 3, wherein each step (b) includes the step of: providing a first form of correction pulse signal to the associated magnetic field gradient during the presence of a non-selective radio-frequency (RF) pulse signal provided to the system when all normal gradient magnetic fields are to have a substantially zero magnitude; and each step (c) includes the step of: adjusting the amplitude of each first form correction pulse signal to provide as uniform an excitation RF magnetic field as possible across the sample.

5. The method of claim 4, wherein each step (b) further comprises the step of: providing the first form pulse signal with a substantially constant amplitude.

6. The method of claim 3, wherein each step (b) includes the step of: providing a second form of correction pulse signal to the associated magnetic field gradient immediately following any response signal acquisition time interval in which a magnetic field gradient of non-zero amplitude is present; and each step (c) includes the step of: adjusting at least one of the amplitude and time duration of each second form correction pulse signal to subtantially cancel the effect of the associated magnetic field gradient generated prior to the start of the correction pulse signal.

7. The method of claim 6, wherein step (b) further comprises the step of: providing the second form pulse signal with a substantially constant amplitude.

8. The method of claim 3, wherein step (b) includes the step of: providing a third form of correction pulse signal to the associated magnetic field gradient immediately following any spatially-selective radio-frequency (RF) pulse signal; and each step (c) includes the step of: adjusting at least one of the amplitude and time duration of each third form correction pulse signal to substantially cancel the effect of temporal asymmetry of the magnetic field gradient that is applied during application of the spatially-selective RF pulse, upon that magnetic field gradient associated with selection of a slice of the sample.

9. The method of claim 8, wherein step (b) further comprises the step of: providing the third form pulse signal with a substantially constant amplitude.

10. The method of claim 3, where each step (b) includes the step of: providing a fourth form of correction pulse signal to the associated magnetic field gradient during each time interval in which response data is received from the sample; and each step (c) includes the step of: adjusting at least one of the amplitude and timing of each fourth form correction pulse signal to substantially cancel the effect of any magnetic field gradient error present during the associated response data readout time interval.

11. The method of claim 10, wherein step (c) further includes the steps of: adjusting the initiation time of the correction pulse signal to occur at a selected time not later than the commencement of the response signal acquisition time interval; and adjusting the correction pulse signal amplitude to be an exponentially decaying function of time, after the initiation time of the pulse signal, and to have a selected time constant.

12. The method of claim 3, wherein each step (b) includes the step of: providing a fifth form of correction pulse signal to the associated magnetic field gradient at any time when completely orthogonal magnetic field gradients are required; and each step (c) includes the step of: adjusting at least one of the amplitude waveshape and commencement time of each fifth form correction pulse signal to compensate the magnetic field gradient along one of the system axes from any crosstalk signal introduced therein due to a magnetic field gradient component along a different one of the system axes.

13. The method of claim 12, wherein each pulse signal waveshape is a decaying exponential waveshape, and each step (c) includes the step of: adjusting the time constant of the pulse signal to minimize inter-axes crosstalk.

14. The method of claim 2, wherein step (b) includes the step of: providing a first form of correction pulse signal to the magnetic field gradient during the presence of a non-selective radio-frequency (RF) pulse signal provided to the system when the normal gradient magnetic field is to have a substantially zero magnitude; and step (c) includes the step of: adjusting the amplitude of the first form correction pulse signal to provide as uniform an excitation RF magnetic field as possible across the sample.

15. The method of claim 11, wherein step (b) further comprises the step of: providing the first form pulse signal with a substantially constant amplitude.

16. The method of claim 2, wherein step (b) includes the step of: providing a second form of correction pulse signal to the magnetic field gradient immediately following any response signal acquisition time interval in which the magnetic field gradient is present with a non-zero amplitude; and step (c) includes the step of: adjusting at least one of the amplitude and time duration of the correction gradient magnetic field pulse signal to substantially cancel the effect of the magnetic field gradient generated prior to the start of the correction pulse signal.

17. The method of claim 16, wherein step (b) further comprises the step of: providing the second form pulse signal with a substantially constant amplitude.

18. The method of claim 2, wherein step (b) includes the step of: providing a third form of correction pulse signal to the magnetic field gradient immediately following any spatially-selective radio-frequency (RF) pulse signal; and step (c) includes the step of: adjusting at least one of the amplitude and time duration of the correction pulse signal to substantially cancel the effect of temporal asymmetry of the magnetic field gradient that is applied during application of the spatially-selective RF pulse upon the magnetic field gradient associated with selection of a slice of the sample.

19. The method of claim 18, wherein step (b) further comprises the step of: providing the third form pulse signal with a substantially constant amplitude.

20. The method of claim 2, where step (b) includes the step of: providing a fourth form of correction pulse signal to the magnetic field gradient during each time interval in which response data is received from the sample; and step (c) includes the step of: adjusting at least one of the amplitude and timing of the correction pulse signal to substantially cancel the effect of any magnetic field gradient error present during the associated response data readout time interval.

21. The method of claim 20, wherein step (c) further includes the steps of: adjusting the initiation time of the correction pulse signal to occur at a selected time not later than the commencement of the response signal acquisition time interval; and adjusting the correction pulse signal amplitude to be an exponentially decaying function of time, after the initiation time of the pulse signal, and to have a selected time constant.

22. The method of claim 2, wherein each step (b) includes the step of: providing a fifth form of correction pulse signal to the associated magnetic field gradient at any time when completely orthogonal magnetic field gradients are required; and each step (c) includes the step of: adjusting at least one of the amplitude waveshape and commencement time of each fifth form correction pulse signal to compensate the magnetic field gradient along one of the system axes from any crosstalk signal introduced therein due to a magnetic field gradient component along a different one of the system axes.

23. The method of claim 22, wherein each pulse signal waveshape is a decaying exponential waveshape, and each step (c) includes the step of: adjusting the time constant of the pulse signal to minimize inter-axes crosstalk.

24. The method of claim 1, wherein a plurality of coordinated different pairs of steps (b) and (c) are selected, from the set of steps (b1–b5) and steps (c1–c5); and utilized:

(b1) providing a first form of correction pulse signal to the associated magnetic field gradient during the presence of each non-selective radio-frequency (RF) pulse signal; and (c1) adjusting each first form correction pulse signal, if used, to have an amplitude selected to provide a substantially uniform excitation RF magnetic field across the sample;

(b2) providing a second form of correction pulse signal to the associated magnetic field gradient immediately following any response signal acquisition time interval in which a non-zero amplitude magnetic field gradient is present; and (c2) adjusting at least one of the amplitude and time duration of each second form correction pulse signal, if used, to substantially cancel the effect of the non-zero amplitude magnetic field gradient present during the response signal acquisition;

(b3) providing a third form of correction pulse signal to the magnetic field gradient immediately following any spatially-selective RF pulse; and (c3) adjusting at least one of the amplitude and time duration of each third form correction pulse signal, if used, to substantially cancel effects of temporal asymmetry of that magnetic field gradient applied during application of the spatially-selective RF pulse;

(b4) providing a fourth form of correction pulse signal to the associated magnetic field gradient during each time interval in which response data is received from the sample; and (c4) adjusting at least one of the initial amplitude, waveshape and time constant, and timing of the commencement each fourth form correction pulse signal to substantially cancel the effect of any magnetic field gradient error present during the associated response signal acquisition time interval; and (b5) providing a fifth form of correction pulse signal to the associated magnetic field gradient at any time when completely orthogonal gradient magnetic fields are required; and (c5) adjusting at least one of the amplitude, waveshape and time constant, and timing of the commencement of each fifth form correction pulse signal to compensate at least one associate pair of magnetic field gradients from any crosstalk therebetween.

* * * * *